(12) United States Patent
Sasaguri (10) Patent No.: US 7,112,353 B2
(45) Date of Patent: Sep. 26, 2006

(54) FILM DEPOSITION APPARATUS AND FILM DEPOSITION METHOD

(75) Inventor: Daisuke Sasaguri, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 438 days.

(21) Appl. No.: 10/430,216

(22) Filed: May 7, 2003

(65) Prior Publication Data
US 2003/0233981 A1    Dec. 25, 2003

(30) Foreign Application Priority Data
Jun. 21, 2002    (JP)    ............... 2002/180720

(51) Int. Cl.
C23C 8/06    (2006.01)
(52) U.S. Cl. ............... 427/585; 427/77
(58) Field of Classification Search ............ 427/77, 427/585
See application file for complete search history.

(56) References Cited

U.S. PATENT DOCUMENTS

| 4,559,901 A | * | 12/1985 | Morimoto et al. .... | 118/723 CB |
| 4,740,263 A | | 4/1988 | Imai et al. ................. | 156/613 |
| 5,662,877 A | * | 9/1997 | Shibahara et al. ......... | 423/446 |
| 5,982,095 A | * | 11/1999 | Jin et al. ...................... | 313/582 |
| 6,161,499 A | * | 12/2000 | Sun et al. ................. | 118/723 E |
| 6,200,652 B1 | * | 3/2001 | Sun et al. ................... | 427/573 |
| 6,551,471 B1 | * | 4/2003 | Yamaguchi et al. ... | 204/192.12 |

FOREIGN PATENT DOCUMENTS

| JP | 60-221395 | 11/1985 |
| JP | 4-16593 | 1/1992 |

OTHER PUBLICATIONS

Hideki Matsumura, "Summary of Research in NEDO Cat—CVD Project in Japan"; Ext. Abstr. 1st Intern. Conf. On Cat-CVD Process, Nov. 1-14, 2000, Kanazawa, Japan.

* cited by examiner

Primary Examiner—Bret Chen
(74) Attorney, Agent, or Firm—Fitzpatrick, Cella, Harper & Scinto (57) ABSTRACT

A film deposition apparatus for forming a film on a substrate includes a chamber capable of maintaining a reduced-pressure atmosphere. The chamber includes a control electrode, a substrate holder opposite to the control electrode, the substrate holder holding the substrate, and a filament for emitting electrons disposed between the substrate holder and the control electrode. The film deposition apparatus further includes a unit for controlling the potential applied to the control electrode to be lower than the potential applied to the filament and a unit for controlling the potential applied to the substrate to be higher than the potential applied to the filament.

7 Claims, 12 Drawing Sheets

FILM DEPOSITION APPARATUS AND FILM DEPOSITION METHOD

BACKGROUND OF THE INVENTION

1. Field of the Invention

The present invention relates to a film deposition apparatus and a film deposition method for forming a film on a substrate, and methods for making an electron-emitting device, an electron source, and an image-forming device using the film deposition method.

2. Description of the Related Art

Conventional film deposition apparatuses are, for example, chemical vapor deposition (CVD) systems and sputtering systems. Furthermore, a catalytic chemical vapor deposition (Cat-CVD) apparatus that deposits a film by heating a tungsten wire and a hot-filament chemical vapor deposition (HF-CVD) apparatus are advantageous in terms of low production costs and large-area deposition.

In typical Cat-CVD apparatuses, a source gas is decomposed with a catalytic filament for depositing a film on a substrate as disclosed by Hideki Matsumura, "Extended Abstract of Open Meeting of Cat-CVD project", 1999, p. 1, or a bias voltage is applied to a substrate while the substrate is irradiated with electrons generated from a heated filament for forming diamond as disclosed in Japanese Patent Laid-Open No. 60-221395.

Figure 10:
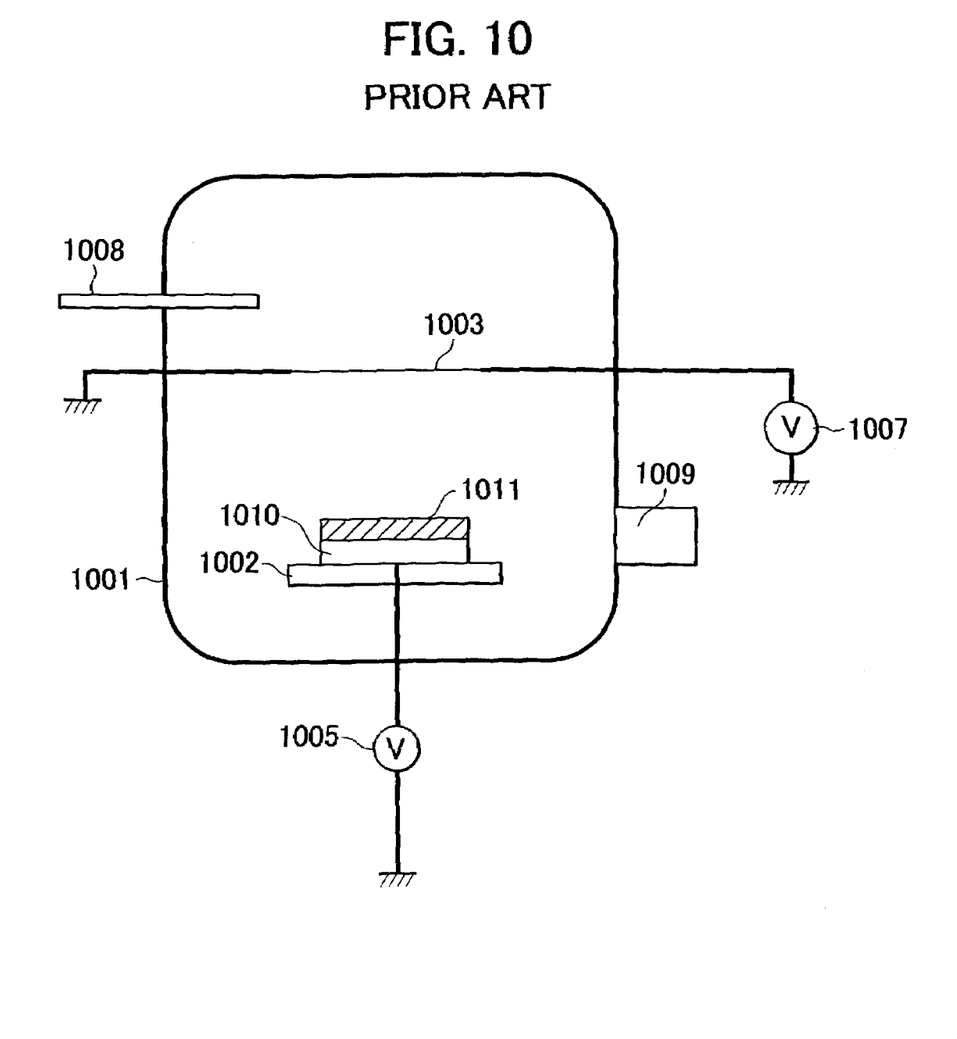
FIG. 10 is a schematic view of a conventional film deposition apparatus.

Referring to FIG. 10, in the Cat-CVD apparatus and the HF-CVD apparatus, for example, a film is deposited while electrons are radiated in order to improve the film deposition rate and the film quality as disclosed in Japanese Patent Laid-Open No. 60-221395. In FIG. 10, reference numeral 1001 represents a vacuum chamber, reference numeral 1002 represents a substrate holder, reference numeral 1003 represents a filament, reference numeral 1005 represents a substrate bias power source, reference numeral 1007 represents a filament heating source, reference numeral 1008 represents a gas inlet, reference numeral 1009 represents a vacuum pumping system, reference numeral 1010 represents a substrate, and reference numeral 1011 represents a deposited film.

Figure 12:
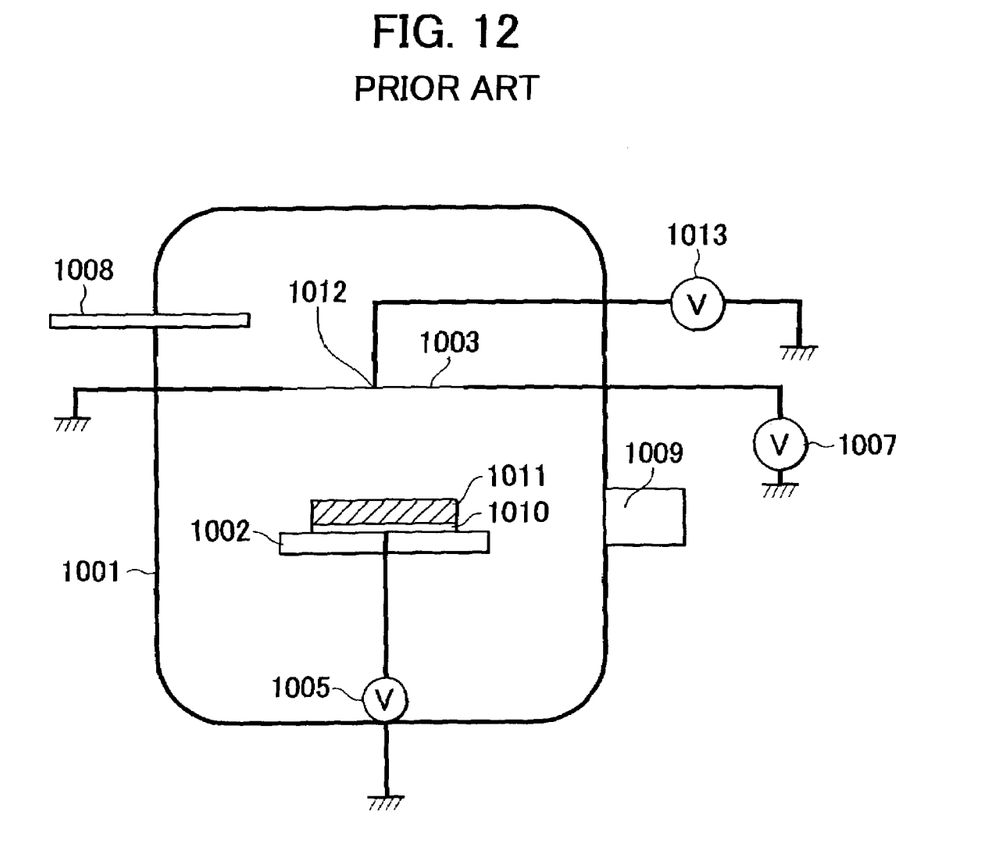
FIG. 12 is a schematic view of another conventional film deposition apparatus.

Referring to FIG. 12, in another example disclosed in Japanese Patent Laid-Open No. 4-16593, a terminal 1012 that corrects the potential of a filament 1003 is provided in order to improve the uniformity of the film.

SUMMARY OF THE INVENTION

Conventional CVD apparatuses and sputtering deposition apparatuses for forming films with large areas inevitably require great expenditures and tend to be of large sizes.

Figure 11:
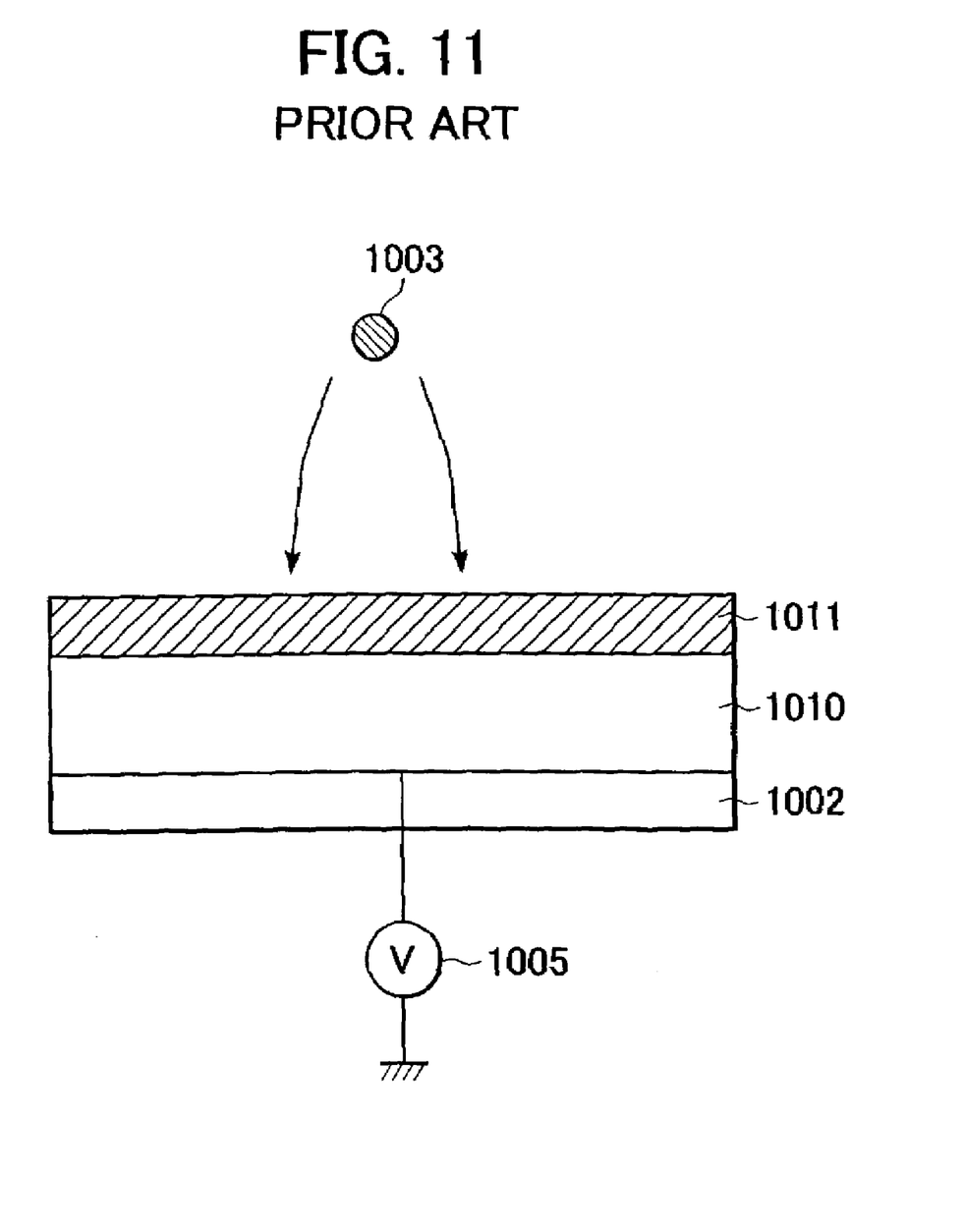
FIG. 11 is a conceptual diagram of a conventional film deposition apparatus.

In the apparatus shown in FIG. 10, the electron path from the filament is determined by the potential distribution between the substrate and the filament. That is, as shown in FIG. 11, electrons reach only right below the filament, thus limiting the deposition area. Accordingly, depositing a uniform film over a large area is difficult for this apparatus shown in FIG. 12.

An object of the present invention, for solving the above problems, is to provide a HF-CVD apparatus for forming a uniform film over a large area on a substrate in which the substrate is effectively irradiated with electrons generated from a filament and a film deposition method.

In accordance with a first aspect, the present invention provides a film deposition apparatus for forming a film on a substrate, including a chamber capable of maintaining a reduced-pressure atmosphere, the chamber including a control electrode, a substrate holder opposite to the control electrode, the substrate holder holding the substrate, and a filament for emitting electrons disposed between the substrate holder and the control electrode; means for controlling the potential applied to the control electrode to be lower than the potential applied to the filament; and means for controlling the potential applied to the substrate to be higher than the potential applied to the filament. This film deposition apparatus can produce a film with high uniformity over a large area.

Preferably, the control electrode is a flat plate. Preferably, the control electrode is substantially parallel to the substrate. Preferably, an AC voltage is applied to the filament. Preferably, the potential of the inner wall of the chamber is higher than that of the control electrode and lower than that of the substrate.

In accordance with the second aspect, the present invention also provides a film deposition method for forming a film including the steps of disposing a filament emitting electrons between a control electrode and a substrate spaced opposite to the control electrode; and heating the filament in a source gas atmosphere containing a source gas for forming the film, while applying a potential to the control electrode less than a potential applied to the filament and applying a potential to the substrate higher than the potential applied to the filament, thereby forming the film on the substrate. This film deposition method can produce a film with high uniformity over a large area.

Preferably, the mean free path of the electrons emitted toward the substrate during the formation of the film is greater than the distance between the filament and the substrate. Preferably, the potential between the substrate and the filament is varied during the formation of the film. Preferably, the source gas is a hydrocarbon gas.

In accordance with a third aspect, the present invention also provides a method for making an electron-emitting device having a substrate, a cathode on the substrate, and an electron-emitting film on the cathode, the electron-emitting film being formed by the film deposition method according to the second aspect. This electron-emitting device exhibits uniform properties over a large area.

In accordance with a fourth aspect, the present invention also provides a method for making an electron source having a substrate and a plurality of electron-emitting devices on the substrate, the plurality of electron-emitting devices being formed by the method according to the third aspect. This electron source exhibits uniform properties over a large area.

In accordance with a fifth aspect, the present invention also provides a method for making an image-forming apparatus having an electron source and a light-emitting element that emits light by electron irradiation, the electron source being formed by the method according to the fourth aspect. This image-forming apparatus can form a high-definition image.

Further objects, features and advantages of the present invention will become apparent from the following description of the preferred embodiments (with reference to the attached drawings).

DESCRIPTION OF THE PREFERRED EMBODIMENTS

The preferred embodiments of the present invention will now be described in detail with reference to the drawings. The size, material, shape, relative position, and other features of each component described in the embodiments do not limit the scope of the invention unless otherwise specified.

Figure 1:
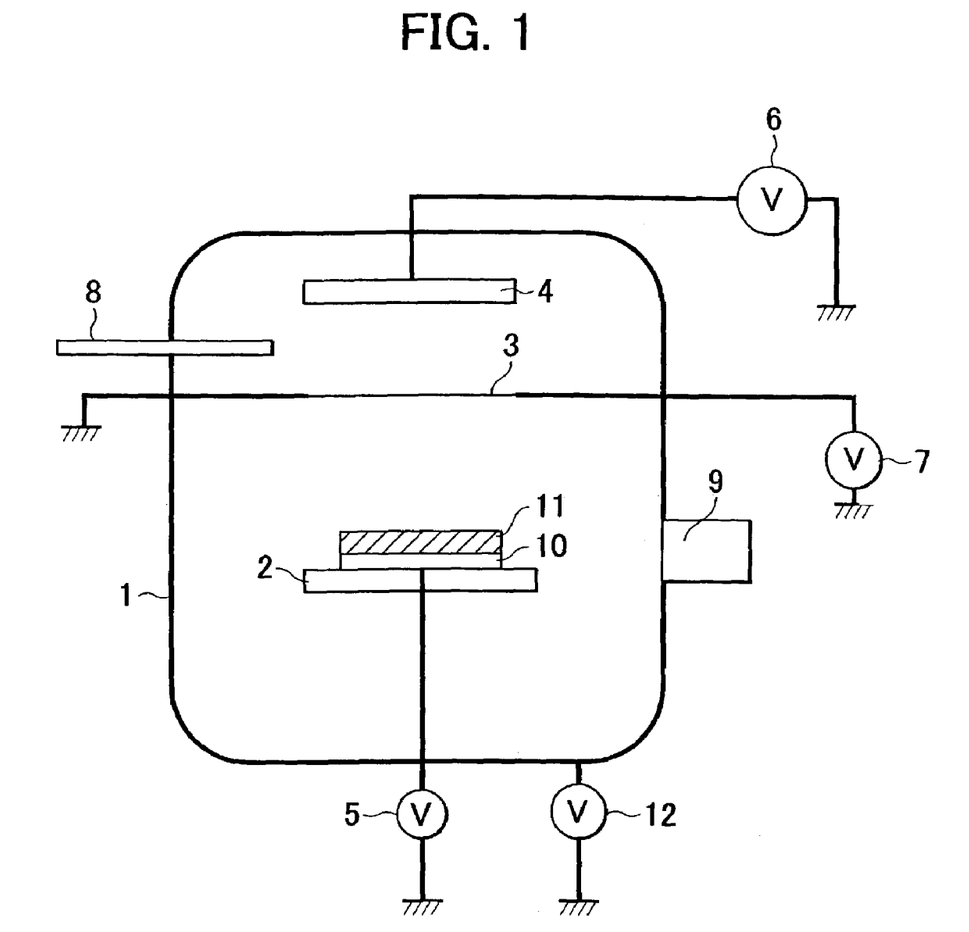
FIG. 1 is a schematic view of a film deposition apparatus of the present invention.
Figure 2:
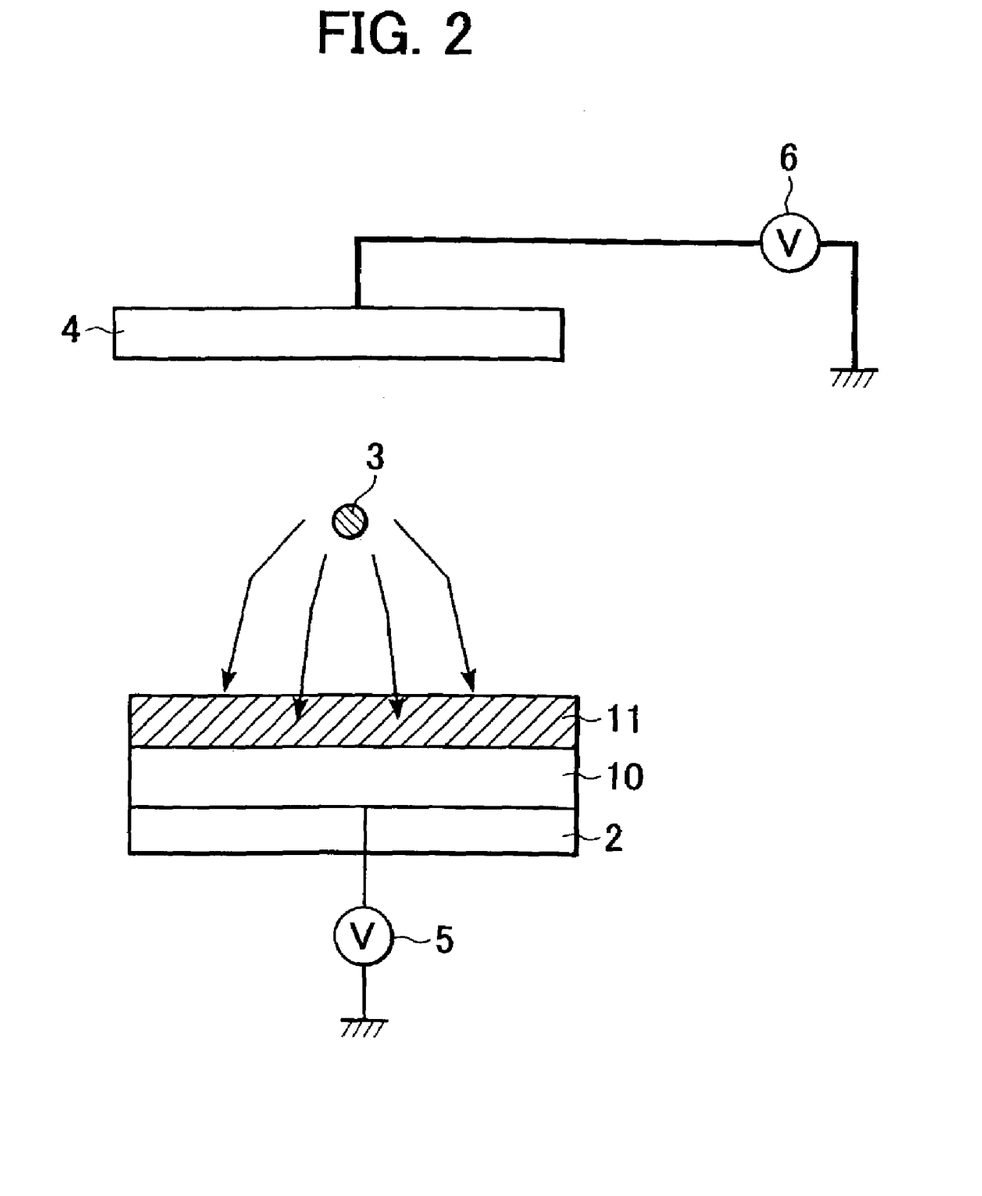
FIG. 2 is a conceptual diagram of a film forming apparatus of the present invention.

FIG. 1 is a schematic view of a fundamental film deposition apparatus of the present invention. This film deposition apparatus includes a vacuum chamber 1, a substrate holder 2, a filament 3, a control electrode 4 opposite to a substrate 10, a substrate bias power supply 5, a control-electrode power supply 6, a filament heating power supply 7, a gas inlet 8, a vacuum pumping system 9, and a power source 12 for controlling the potential of the chamber. A film 11 is deposited on the substrate 10 that is held on the substrate holder 2.

A mechanism for forming a film in the film deposition apparatus of the present invention will now be described. A voltage is applied between the substrate 10 and the filament 3 such that the substrate 10 is positively biased in a source gas atmosphere. Furthermore, another voltage is applied between the control electrode 4 and the filament 3 such that the control electrode 4 is negatively biased. When the filament 3 is heated under these conditions, thermal electrons generated from the filament 3 decompose the source gas to deposit the film 11 on the substrate 10.

As described above, in a conventional HF-CVD apparatus, the electron path is determined by the potential distribution between the substrate and the filament. Thus, electrons reach only right below the filament, thus limiting the deposition area. Accordingly, this apparatus cannot deposit a uniform film with a large area.

The voltage V1 applied to the substrate is typically from about 10 to 2000V, preferably from about 100 to 1000V and most preferably from about 150 to 400V. The voltage V2 applied to the control electrode generally ranges from −10 to −200V, more preferably from −10 to −100V and most preferably from −40 to −60V. The voltage V3 applied to the filament is generally from about −50 to 50V and more preferably from about −10 to 10V. The relationship between V1, V2 and V3 is V2<V3<V1.

In contrast, in the film deposition apparatus of the present invention, as shown in FIG. 1, the control electrode 4 opposite to the substrate 10 is provided above the filament 3. Thus, the control electrode 4 can control the electron path from the filament 3 such that the surface of the substrate 10 is uniformly irradiated with electrons. Thus, the deposited film 11 has high uniformity.

Figure 3:
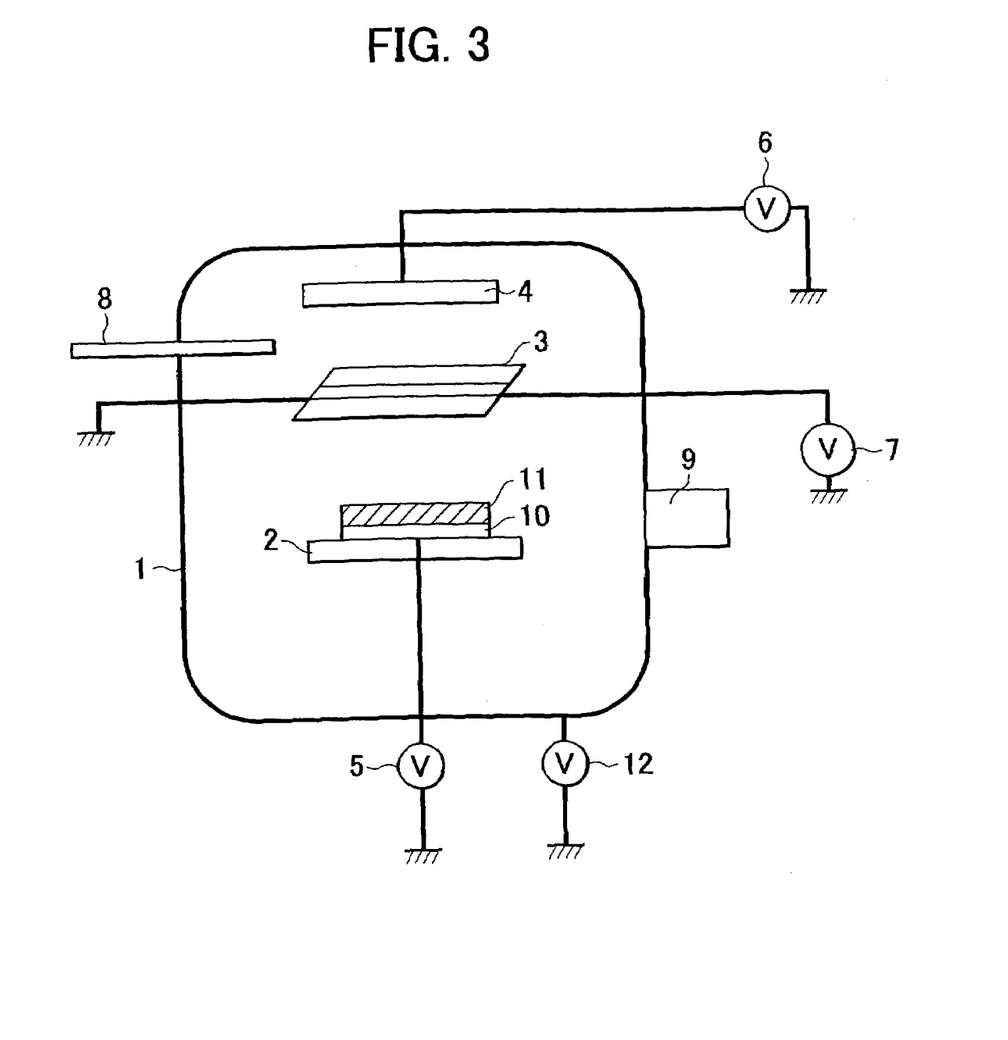
FIG. 3 is a schematic view of another film deposition apparatus of the present invention.

Furthermore, as shown in FIG. 3, the area of the filament 3 is expanded while the potential between the substrate 10 and the control electrode 4 is controlled to form a uniform film over a large area. The voltage applied to the control electrode 4 depends on the size of the substrate 10 and the shape and potential of the filament 3 and is optimized in the designing process of the apparatus.

Preferably, the control electrode 4 is a flat plate and is parallel to the substrate 10. The size of the control electrode 4 may be optimized in consideration of the film deposition area and the potential distribution.

In the film deposition apparatus of the present invention, preferably, the power source 12 controls such that the potential of the vacuum chamber 1 at the inner wall is higher than that of the control electrode 4 and is lower than that of the substrate 10. Typically, the film 11 may be deposited at a grounded state to suppress collision of electrons and ions to the inner wall of the film deposition apparatus and thus to prevent unnecessary contaminants to deposit on the inner wall.

When a substrate is irradiated with electrons in a source gas atmosphere, positively charged ions are generated between the substrate and a filament in the film deposition process. The ions are concentrated to a vicinity of the filament having a lower potential between the substrate and the filament and disturb the potential distribution. However, the film deposition apparatus of the present invention is provided with the control electrode 4 that effectively removes the ions. Since the potential distribution in the apparatus is maintained at a normal state, the substrate 10 is effectively irradiated with electrons.

Figure 4:
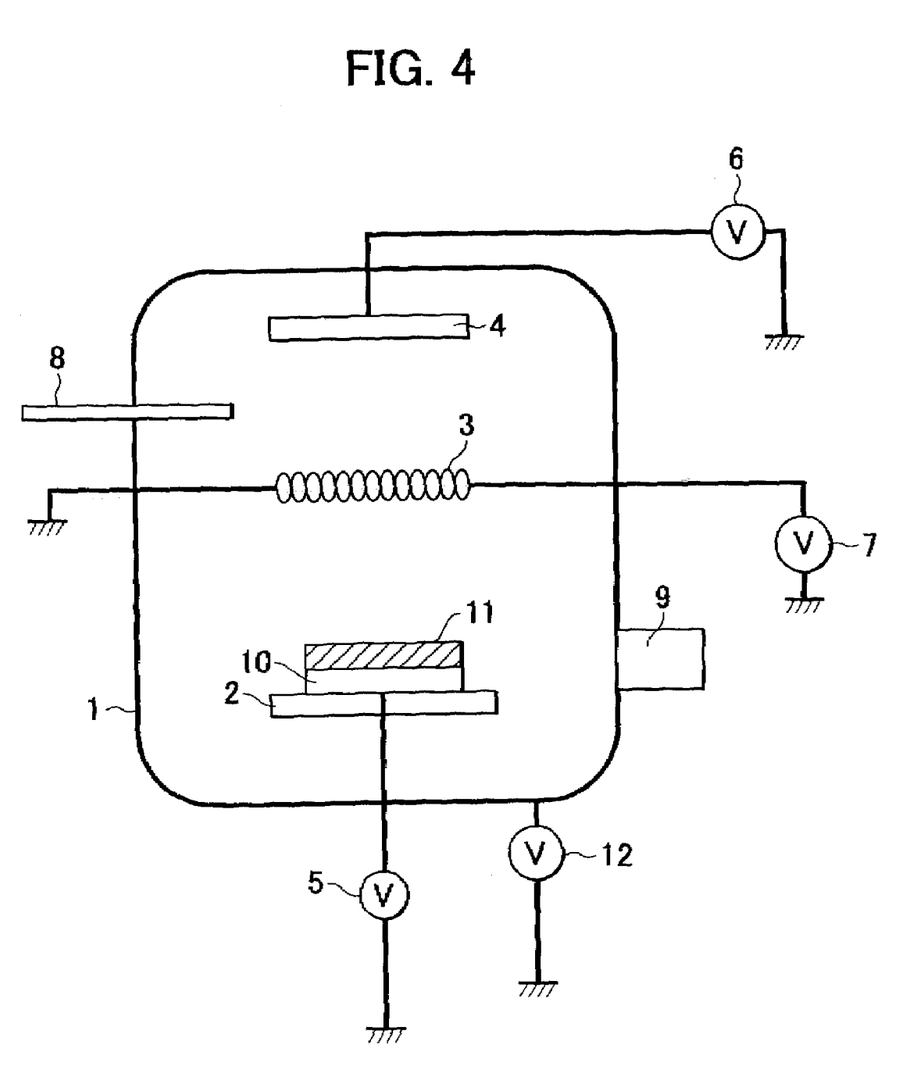
FIG. 4 is a schematic view of another film deposition apparatus of the present invention.

The shape of the filament 3 in the present invention may be linear as shown in FIG. 1 or spiral as shown in FIG. 4. An AC voltage, which does not significantly affect the electron path, is preferably applied for heating the filament 3.

In the film deposition method of the present invention, the film quality can be controlled by the energy of the electrons that collide with substrate, if required. For example, high-energy electrons are emitted in a hydrocarbon gas as the source gas to improve the crystallinity of carbon.

When the film quality is controlled by the energy of the electrons colliding with the substrate, the substrate is preferably irradiated with electrons having uniform energy for controlling the film quality satisfactorily. More specifically, electrons from the filament can reach the substrate, almost without colliding with gas molecules and the like.

Figure 5:
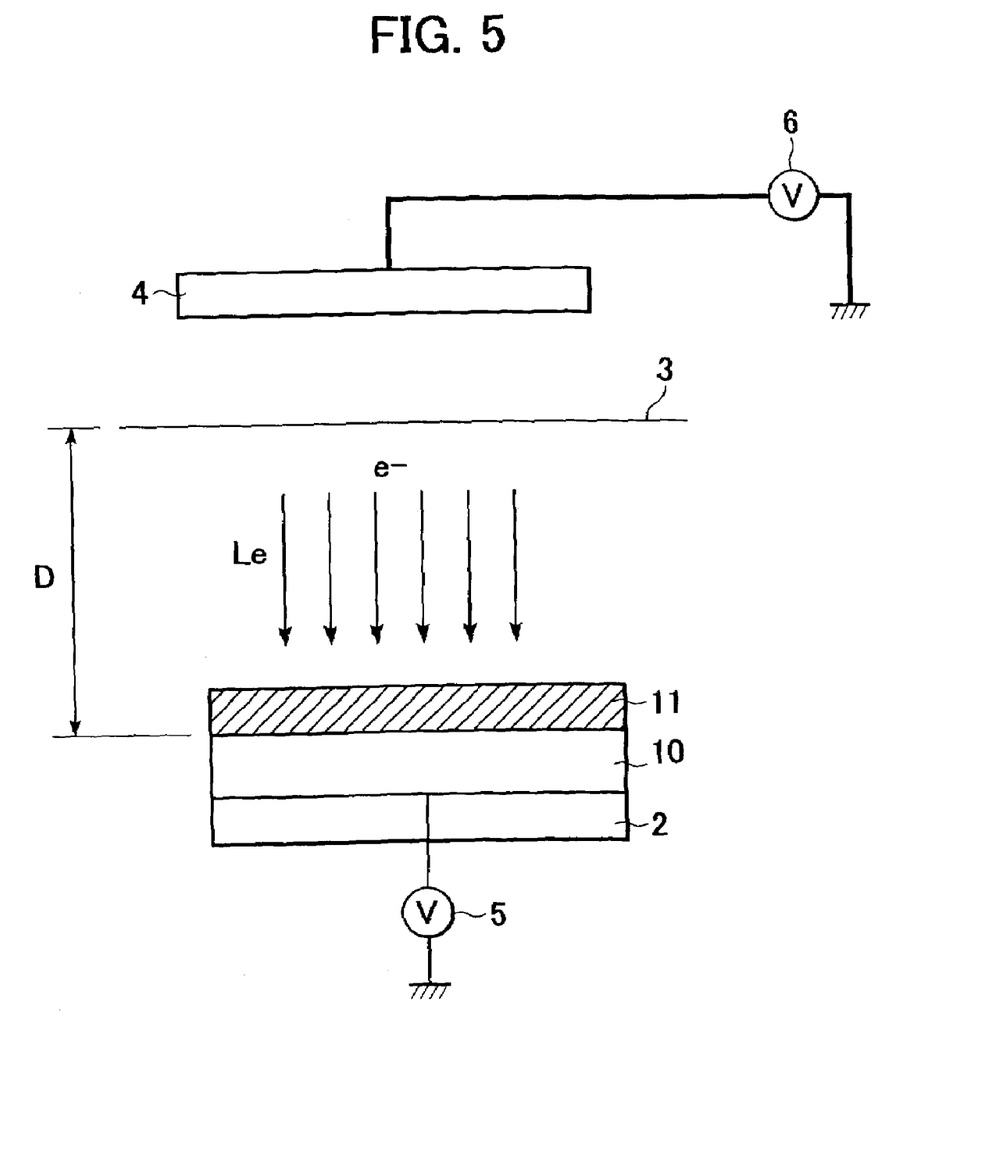
FIG. 5 is a conceptual diagram of another film forming apparatus of the present invention.
Figure 6:
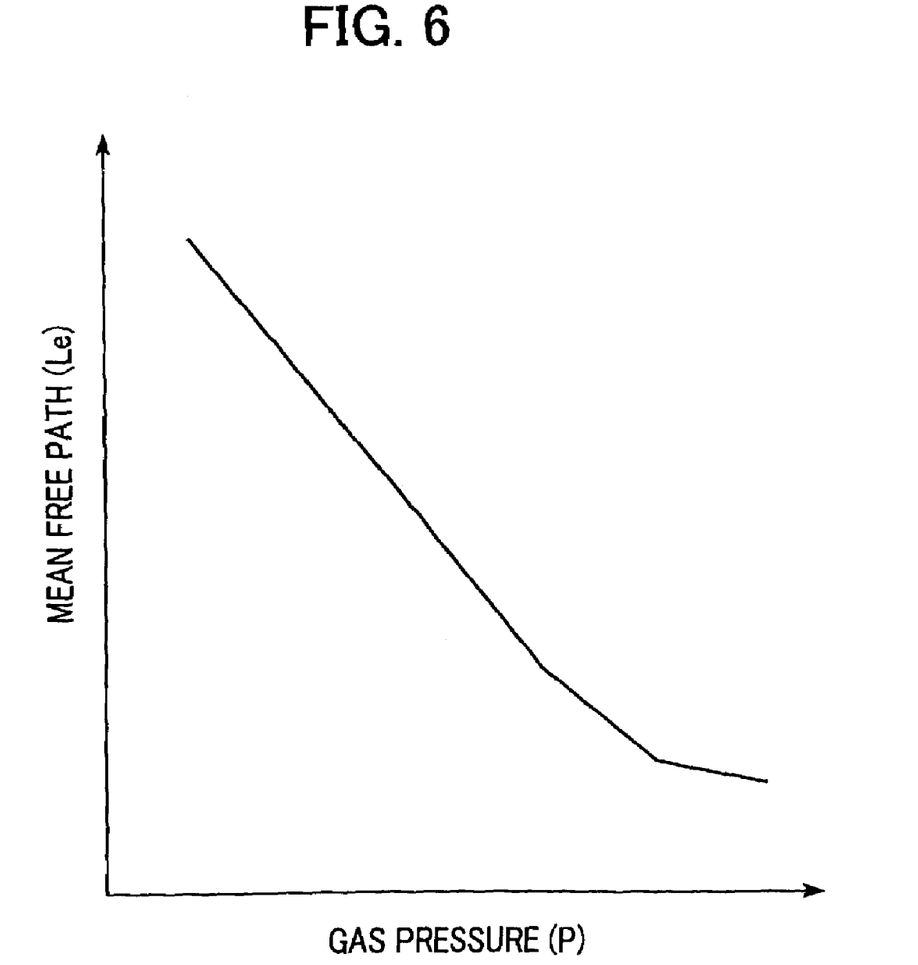
FIG. 6 is a graph illustrating the relationship between the mean free path and the pressure of a gas used in film deposition.

Referring to FIG. 5, if the mean free path Le of electrons from the filament 3 is greater than the distance D between the substrate 10 and the filament 3 (Le>D), most of the accelerated electrons collide with the substrate 10 without substantial scattering between the filament 3 and the substrate 10. Referring to FIG. 6, the mean free path Le of electrons in a source gas atmosphere is basically in reverse proportion to the pressure P of the deposition gas (Le$\alpha$1/P). The substrate surface is maintained at a high-energy state by the energy of accelerated electrons, and the film quality deposited on the substrate varies with the energy.

Under such a condition, a film structure having a film quality profile across the thickness direction can be formed by varying the substrate bias during the film deposition process. An optimized film deposition condition can be selected depending on a required resistance and other properties.

Examples of source gases used in the film deposition method of the present invention are Si-based gases such as silanes for forming polycrystalline silicon and amorphous silicon and typical hydrocarbon gases such as methane ($CH_4$) and ethylene ($C_2H_4$) for forming carbonaceous materials, i.e., graphite and amorphous carbon. These source gases may contain other gases such as hydrogen and nitrogen, if necessary.

Figure 7:
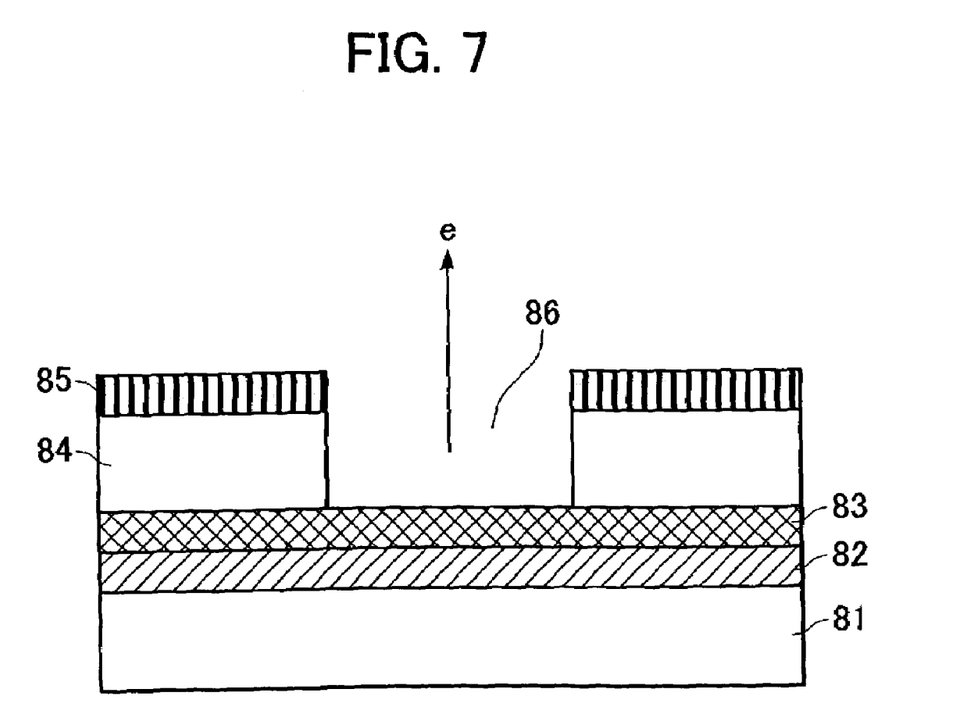
FIG. 7 is a schematic cross-sectional view of an electron-emitting device in accordance with the present invention.

A carbon film may be formed by the film deposition apparatus and the film deposition method according to the present invention to make an electron-emitting device shown in FIG. 7.

This electron-emitting device includes a substrate 81, a cathode electrode 82, and an electron-emitting layer 83 formed by the film deposition method according to the present invention, an insulating layer 84, and a gate electrode 85. Upon application of a voltage between the cathode 82 and the gate electrode 85, electrons are emitted through an opening 86 toward the vacuum.

The cathode electrode 82 and the gate electrode 85 may be composed of general metal materials, and the material and the thickness thereof may be optimized depending on the resistance and the production process.

A plurality of such electron-emitting devices may be arranged on a substrate to form an electron source or an image-forming apparatus.

These electron-emitting devices may be arranged in various manners. For example, the electron-emitting devices are arranged in a simple matrix in the X and Y directions. First electrodes of the electron-emitting devices lying in the same row are commonly connected to an X-wiring line, whereas second electrodes of the electron-emitting devices lying in the same column are commonly connected to a Y-wiring line.

Figure 8:
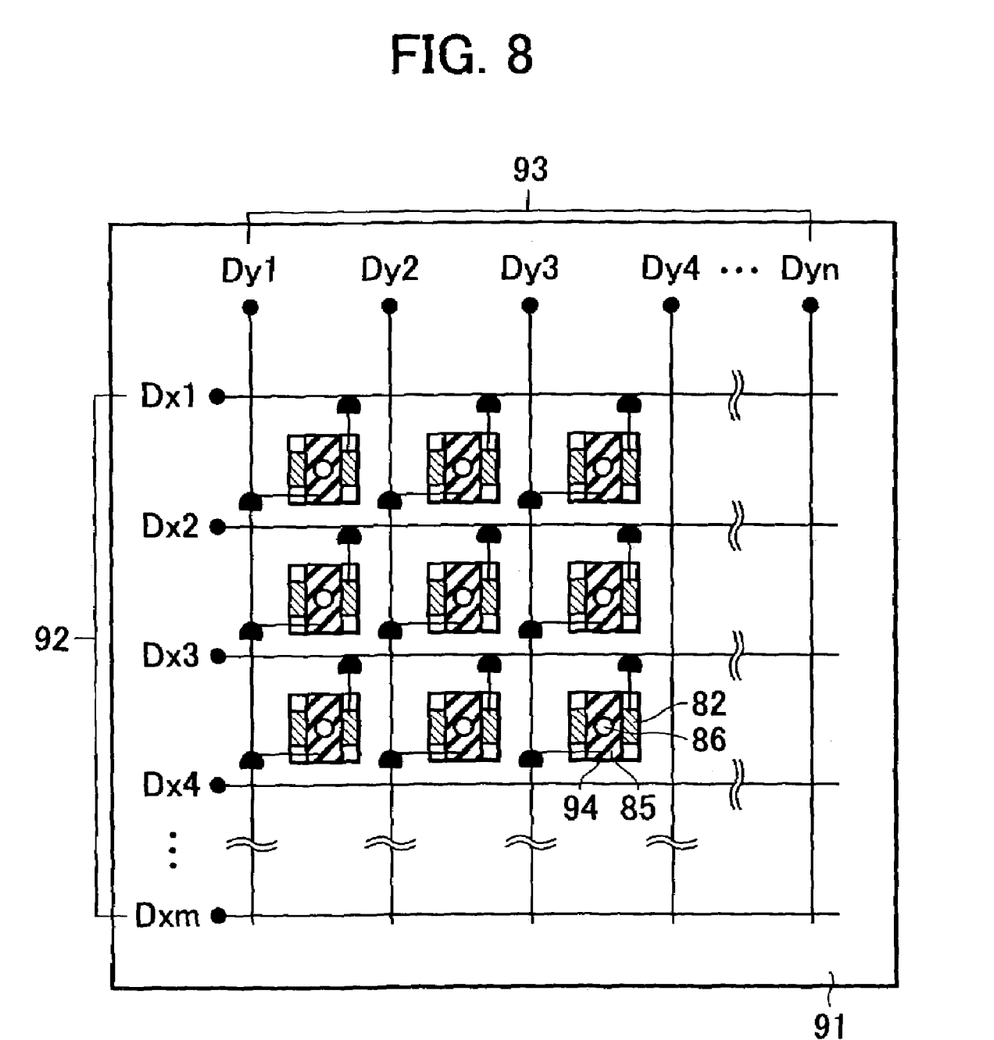
FIG. 8 is a schematic view of an electron source with a simple matrix arrangement in accordance with the present invention.

Referring to FIG. 8, an electron source of a simple matrix arrangement including a plurality of the electron-emitting devices of the present invention will now be described. The electron source includes an electron source substrate 91, X-wiring lines 92, Y-wiring lines 93, and electron-emitting devices 94 as shown in FIG. 7.

The X-wiring lines 92 (Dx1, Dx2, . . . , Dxm) are composed of a conductive metal and are formed by a vacuum deposition process, a printing process, or a sputtering process. The material, thickness, and width of the X-wiring lines 92 may be properly determined. The Y-wiring lines 93 (Dy1, Dy2, . . . , Dyn) may also be formed as in the X-wiring lines 92. Insulating interlayers (not shown) are provided between the m X-wiring lines 92 and the n Y-wiring lines 93 to isolate these lines electrically, wherein m and n are each an positive integer).

The insulating interlayers are composed of $SiO_2$ or the like formed by vacuum deposition, printing, or sputtering. For example, these are formed on the entire or partial surface provided with the X-wiring lines 92 of the substrate 91. The thickness, material, and production process of the interlayers are determined so that the interlayers are resistive against the potential difference at the intersections between the X-wiring lines 92 and the Y-wiring lines 93. The X-wiring lines 92 and the Y-wiring lines 93 are extracted as external terminals.

A pair of device electrodes (the above-described electrodes 82 and 85) of an electron-emitting device 94 are electrically connected to each of the m X-wiring lines 92 and each of the n Y-wiring lines 93 through conductive metal tie lines.

The X-wiring lines 92, the Y-wiring lines 93, the tie lines, and the device electrodes may be formed of the same material or different materials, depending on the process and the like. When these wiring lines and the device electrodes are formed of the same material, the wiring lines connected to the device electrodes may also be called device electrodes.

The X-wiring lines 92 are connected to scanning signal applying means (not shown) that applies a scanning signal for selecting a row of the electron-emitting devices 94 in the X direction. The Y-wiring lines 93 are connected to modulation signal applying means (not shown) that modulates signals input to a column of the electron-emitting devices 94 in the Y direction. A driving voltage applied to each electron-emitting device is supplied as a differential voltage between the scanning signal and the modulation signal that are applied to the electron-emitting device.

Figure 9:
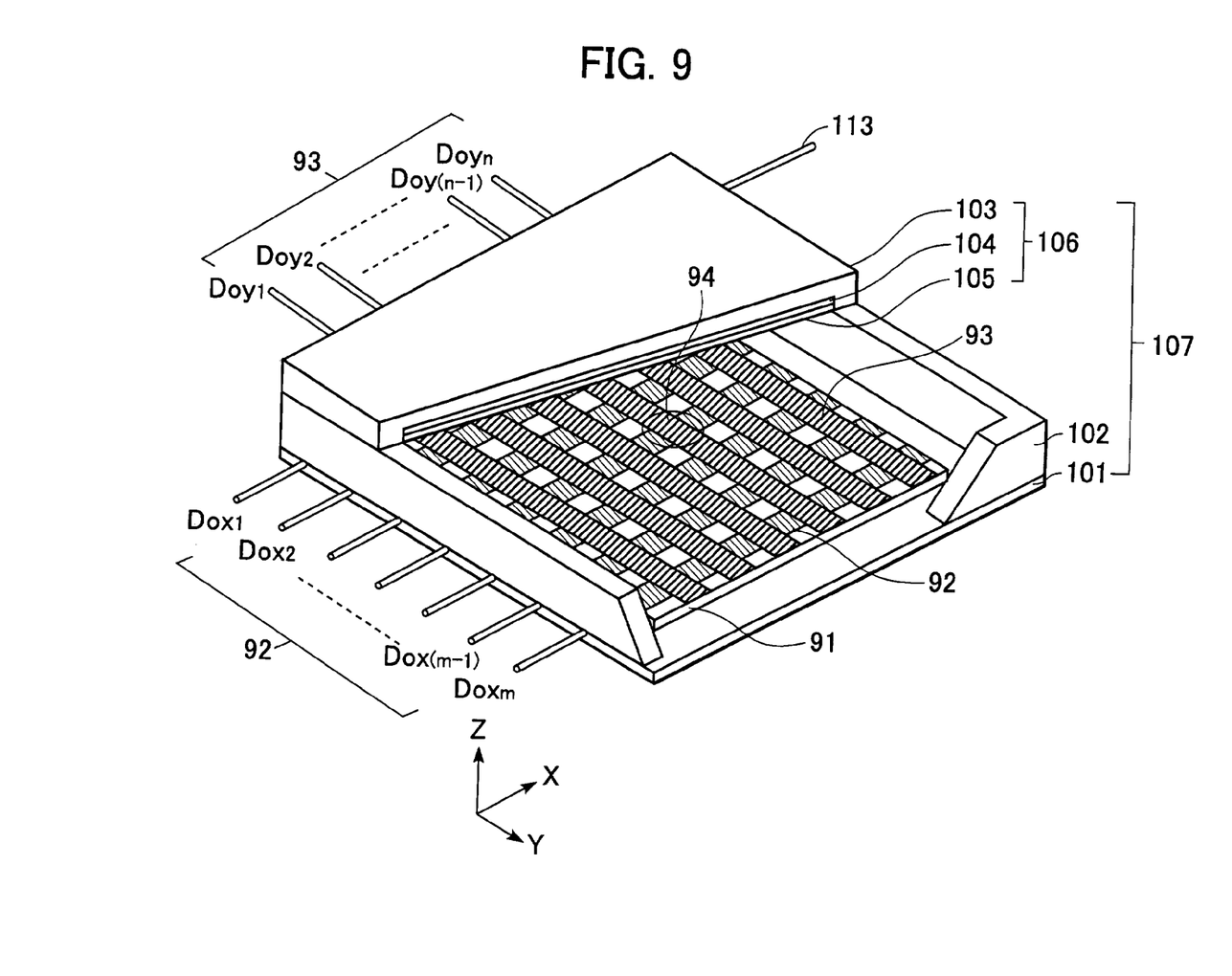
FIG. 9 is a schematic view of an image-forming device in accordance with the present invention.

In this structure, each device can be separately driven by a simple matrix wiring. Referring to FIG. 9, an image-forming-apparatus including electron sources having a simple matrix array will be described. FIG. 9 shows an exemplary display panel of the image-forming apparatus.

The display panel includes an electron source substrate 91 having an array of a plurality of electron-emitting devices, a rear plate 101 that fixes the substrate 91, and a face plate 106 composed of a glass substrate 103 that has a phosphor film(light-emitting element) 104 and a metal back 105 on the inner face thereof. The rear plate 101 and the faceplate 106 are connected to a frame 102 with frit glass or the like. The rear plate 101, the face plate 106, and the frame 102 constitute an envelope 107. The envelope 107 is baked at a temperature in the range of 400° C. to 500° C. for at least 10 minutes in air or nitrogen and is sealed.

The rear plate 101 is provided to enhance the mechanical strength of the substrate 91. If the substrate 91 has sufficiently high mechanical strength, the rear plate 101 may be omitted. In such a case, the frame 102 may be directly bonded to the substrate 91 so that the faceplate 106, the frame 102, and the substrate 91 constitute the envelope 107. Alternatively, a spacer (not shown in the drawing) may be disposed between the faceplate 106 and the rear plate 101 to reinforce the envelope 107 against atmosphere.

A vacuum sealing process for sealing the envelope (panel) will now be described. The envelope 107 is maintained at a temperature in the range of 80° C. to 250° C. while being evacuated through an exhaust pipe (not shown) by an exhaust system, i.e., an ion pump or a sorption pump to remove organic components thoroughly. Next, the exhaust pipe is melt-sealed by heat of a burner. The sealed envelope 107 may be subjected to getter treatment to maintain the sealed pressure. The getter treatment indicates heating of a getter (not shown) disposed at a given position in the envelope 107 by resistance heating or RF heating and formation of a deposited film, immediately before or after the sealing of the envelope 107. In general, the getter is composed primarily of Ba, and the deposited film has an adsorption effect to maintain the atmosphere inside the envelope 107.

The electron-emitting devices of the resulting image-forming apparatus including a simple matrix array of electron sources emit electrons upon a voltage applied through the external terminals Dox1 to Doxm and Doy1 to Doyn. A high voltage is applied to the metal back 105 or a transparent electrode (not shown) from a high-voltage terminal 113 to accelerate the electron beams. The accelerated electrons collide with the phosphor film 104 to emit fluorescence, resulting in formation of an image.

In the above embodiments, the electron-emitting device, the electron source, and the image-forming apparatus are described as exemplary applications of the film deposition apparatus and the film deposition method. The film deposition apparatus and the film deposition method of the present invention may also apply to various devices having large areas and uniform properties.

EXAMPLES

The present invention will now be described in further detail by the following EXAMPLES.

Example 1

A carbon film was deposited on a substrate using an apparatus shown in FIG. 1. A tungsten filament 3 with a diameter of 0.5 mm was mounted in the vacuum chamber 1, and a Ni control electrode 4 was disposed 10 mm from the tungsten filament 3. The control electrode 4 was connected to the DC power supply 6, whereas the filament 3 was connected to the AC power supply 7.

A square silicon substrate 10 with sides of 30 mm that had been preliminarily cleaned thoroughly was held on the substrate holder 2 so that the substrate 10 was also connected to the DC power supply 5. The substrate 10 was 50 mm from the filament 3. The inner wall of the chamber was grounded.

After the vacuum chamber 1 was thoroughly evacuated, a mixed source gas of $CH_4$ and $N_2$ was introduced so that the chamber pressure was 5 Pa. A voltage of 200 V was applied to the substrate 10 while a voltage of −50 V was applied to the control electrode 4. Furthermore, an AC voltage was applied to the tungsten filament 3 for heating the filament 3 to 1,800° C.

The substrate was irradiated with electrons that were observed as a current of 30 mA, while the control electrode 4 absorbed ions that were observed as a current of −10 mA. This state was continued for 30 minutes. A uniform carbon film was deposited on the Si substrate 10.

Example 2

The film deposition apparatus shown in FIG. 3 was used in EXAMPLE 2. This apparatus is basically the same as that in EXAMPLE 1 except that the filament 3 was composed of ten tungsten wires with a diameter of 0.3 mm and a length of 10 cm, that were disposed in parallel at a distance of 1 cm.

A square glass substrate 10 (10 cm by 10 cm) provided with a 100-nm thick titanium layer deposited thereon was held on the substrate holder 2. After the chamber 1 was thoroughly evacuated, a mixed source gas of $C_2H_4$ and $H_2$ (1:2) was introduced so that the chamber pressure was 5 Pa.

A voltage of 300 V was applied to the substrate 10 while a voltage of −50 V was applied to the control electrode 4. Furthermore, an AC voltage was applied to the tungsten filament 3 for heating the filament 3. The energizing was continued for 30 minutes. A uniform carbon film was deposited in an area of 10 cm by 10 cm.

Example 3

The film deposition apparatus shown in FIG. 4 was used in EXAMPLE 3. This apparatus is basically the same as that in EXAMPLE 1 except that the filament 3 was composed of a spiral tungsten wire with a diameter of 0.5 mm (spiral diameter: 0.5 cm). A carbon film was deposited on the substrate 10 as in EXAMPLE 1. The film deposition rate was higher than that in EXAMPLE 1 because of an increase in electrons that collided with the substrate 10.

Example 4

A carbon film was deposited on a silicon substrate 10 as in EXAMPLE 1 except that the source gas was $CH_4$ and the pressure during the film deposition was 0.1 Pa. The mean free path of electrons in the $CH_4$ atmosphere of 0.1 Pa was about 50 cm. Thus, almost of the electrons emerging from the filament 3 would reach the substrate 10 without collision with the atmospheric gas molecules.

A voltage of 350 V was applied to the silicon substrate 10 while a voltage of −50 V was applied to the control electrode 4. Furthermore, an AC voltage was applied to the tungsten filament 3 for one hour for heating the filament 3 to 1,800° C. The resulting carbon film was observed by transmission electron microcopy. The carbon film had a partial graphite structure.

Example 5

A carbon film was deposited on a silicon substrate 10 as in EXAMPLE 4 except that the voltage applied to the substrate 10 was 150 V. The resulting carbon film was amorphous.

Example 6

A carbon film was deposited on a silicon substrate 10 as in EXAMPLE 4 except that the voltage applied to the substrate 10 was gradually increased from 150 V to 400 v. The resulting carbon film had a profiled structure, that is, the crystallinity of the carbon film gradually increased from the interface to the silicon substrate toward the surface of the carbon film.

The substrate 10 with the carbon film was placed in a vacuum chamber and a positive voltage was applied to the carbon film through a vacuum atmosphere. Stable electron emission with a stable current was observed in an electric field of $5 \times 10^5$ V/cm.

Example 7

A carbon film was deposited on a silicon substrate 10 as in EXAMPLE 4 but the deposition conditions were changed as follows: The voltage applied to the substrate 10 was −100 V, the voltage applied to the control electrode 4 was 50 V. After the substrate 10 was irradiated with ions, a voltage of 350 V was applied to the silicon substrate 10 while a voltage of −50 V was applied to the control electrode 4 so that the substrate 10 was irradiated with electrons. The carbon film had a double-layer structure of a high-resistance carbon lower sublayer and a crystalline carbon upper sublayer.

Example 8

An image-forming apparatus was prepared using an electron source including a matrix of electron-emitting devices, as shown in FIG. 7. The substrate was composed of silicon and had a tantalum cathode with a thickness of 300 nm. A carbon film (electron-emitting film) was deposited on this substrate as in EXAMPLE 2.

A silicon dioxide insulating film 84 with a thickness of 1 μm and a tantalum gate electrode 85 with a thickness of 100 nm were deposited to form a composite structure. After openings with a thickness of 1 μm were formed in the tantalum gate electrode 85, the insulating film 84 was etched with a buffered fluoric acid to expose an electron emitting film 83. Electron-emitting devices with a matrix array (300 by 200 pixels) were thereby formed. Each pixel included 144 electron-emitting devices.

Referring to FIG. 8, X-lines of the matrix lines were connected to cathodes 82 while Y-lines were connected to the gate electrodes 85. Each element was provided with a phosphor element thereon. A 10 kV was applied to the phosphor element while an 18-V pulse signal was applied. A high-definition image was thereby formed.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A film deposition method for forming a film on a substrate comprising the steps of:
    disposing a filament emitting electrons between a control electrode and a substrate spaced opposite to the control electrode; and
    heating the filament in a source gas atmosphere containing a source gas for forming the film, while applying a potential to the control electrode less than a potential applied to the filament and applying a potential to the substrate higher than the potential applied to the filament thereby forming the film on the substrate.

2. The film deposition method according to claim 1, wherein a mean free path of the electrons emitted toward the substrate during the formation of the film is greater than the distance between the filament and the substrate.

3. The film deposition method according to claim 1, wherein the potential between the substrate and the filament is varied during the formation of the film.

4. The film deposition method according to claim 1, wherein the source gas is a hydrocarbon gas.

5. A method for making an electron-emitting device having a substrate, a cathode on the substrate, and an electron-emitting film on the cathode, the electron-emitting film being formed by the film deposition method according to claim 1.

6. A method for making an electron source having a substrate and a plurality of electron-emitting devices on the substrate, the plurality of electron-emitting devices being formed by the method according to claim 5.

7. A method for making an image-forming apparatus having an electron source and a light-emitting element that emits light by electron irradiation, the electron source being formed by the method according to claim 6.

* * * * *